United States Patent [19]

Buntschuh

[11] 4,291,415

[45] Sep. 22, 1981

[54] MICROWAVE INTEGRATED CIRCUIT DOUBLE BALANCED MIXER

[75] Inventor: Charles D. Buntschuh, Bedford, Mass.

[73] Assignee: Microwave Associates, Inc., Burlington, Mass.

[21] Appl. No.: 99,858

[22] Filed: Dec. 3, 1979

[51] Int. Cl.³ .......................... H04B 1/26; H03H 7/42
[52] U.S. Cl. ...................................... 455/328; 333/26
[58] Field of Search ............................... 455/326–328; 333/4.5, 25, 26; 363/157, 159

[56] References Cited

U.S. PATENT DOCUMENTS

| | | | |
|---|---|---|---|
| 3,512,090 | 5/1970 | Mouw | 455/326 |
| 3,652,941 | 3/1972 | Neuf | 455/327 |
| 3,678,395 | 7/1972 | Hunton et al. | 455/327 |
| 3,818,385 | 6/1974 | Mouw | 455/326 |
| 4,032,849 | 6/1977 | Gysel et al. | 455/327 |
| 4,125,810 | 11/1978 | Pavio | 455/327 |

Primary Examiner—Jin F. Ng
Attorney, Agent, or Firm—Wolf, Greenfield & Sacks

[57] ABSTRACT

Double-balanced mixers of the star-configuration type for microwave-frequency electromagnetic waves have a balanced four-wire line realized with a pair of wires on each side of a dielectric substrate, means to feed a first-frequency wave to the line in a parallel-mode, and means to feed a second-frequency wave to the line in a transverse-mode. These waves may be RF and LO signals, respectively, or vice versa. A common star-configuration point is provided, and four diodes in a star configuration are connected to it, one from each wire. IF output is between the common star-configuration point and a common reference terminal (e.g.: ground) for the mixer. The mixer can be fed from balanced or unbalanced RF and/or LO input lines.

10 Claims, 16 Drawing Figures

MICROWAVE INTEGRATED CIRCUIT DOUBLE BALANCED MIXER

BACKGROUND OF THE INVENTION

This invention relates to broadband integrated circuit double-balanced mixers suitable for use in the microwave and millimeter wave bands and capable of broad intermediate frequency (IF) bandwidths, extending to microwave frequencies.

As microwave systems progress into the millimeter wave spectrum, it becomes necessary to develop broadband components for applications in this frequency range. Much of this development involves band extensions of lower frequency systems to 60 GHz and higher. For example, broadband receivers for the 18 to 42 GHz range might split the band into six 4 GHz wide channels, each of which is down converted to a common microwave IF band, say 2 to 6 GHz or 4 to 8 GHz, using a separate mixer. The IF output is then processed further by an existing microwave system.

The invention is directed to the provision of broadband mixers suitable for such millimeter wave downconverter applications. Typical system requirements on such down-converters call for low noise, high IF output frequencies, minimal spurious response, and low cost. Small size and weight are frequently desired. To minimize system noise figure, mixers should have low conversion loss and have a balanced mixer configuration. IF bandwidths should extend at least to 8 GHz. To minimize intermodulation spurious responses, they should be fundamentally rather than subharmonically pumped, and have a double-balanced configuration. Low cost potential, and small size and weight call for the use of microwave integrated circuit technology. Broad RF bandwidths are also desirable, even in cases where the required bandwidth may be no greater than the individual millimeter channel width, so that one mixer can cover many channels without individual tuning.

THE PRIOR ART

The following prior art is listed under the provisions of 37 CFR 1.97 (b):

| U.S. Pat. Nos.: | | | |
|---|---|---|---|
| 3,512,090 | May 19, 1979 | Mouw | 325/442 |
| 3,652,941 | March 28, 1972 | Neuf | 325/446 |
| 3,818,385 | June 18, 1974 | Mouw | 333/26 |

Prior art double balanced microwave mixers have generally been of the ring or star modulator types as described in U.S. Pat. No. 3,652,941, and in U.S. Pat. No. 3,818,385 and its predecessor U.S. Pat. No. 3,512,090, respectively.

The ring mixer consists of four diodes connected in series, in a closed loop with the signal (RF) and local oscillator (LO) fed across alternate pairs of diodes via two-conductor balanced lines. The intermediate frequency (IF) is extracted from one of these two-wire lines through a low-pass filter. In the star modulator one end of each four diodes is connected to a common junction. The four diodes are arranged such that the open ends are alternately anode and cathode. The RF and LO are fed across adjacent pairs of diodes via four two-conductor lines. The IF is extracted between the common junction and ground on an unbalanced two-conductor line. The construction of the star modulator in MIC format in U.S. Pat. No. 3,818,385 requires two circuit boards, sandwiched together to realize the four balanced-to-unbalanced line transformers (baluns) required.

The star modulator represents an improvement over the ring modulator in that it eliminates the low pass filter, providing greater IF bandwidth, and the baluns are an integral part of the mixer circuit, making it simpler and more compact.

It is the object of the present invention to provide a novel and improved star modulator type double balanced mixer suitable for use in the lower millimeter wave spectrums and having high IF frequency capability.

Another object of the invention is to provide a double balanced mixer which eliminates the need for baluns or hybrid junctions when the RF and LO are fed from waveguide or other balanced transmission lines.

A further object of the invention is to provide a double balanced mixer of simple construction and convenient size and shape compared to prior art. It utilizes a single metalized dielectric substrate, whereas prior art mixers require two dielectric substrates and three metal layers. Also the housing involves only simple milling and drilling operations.

A further object of the invention is to provide a double balanced mixer suitable for direct integration into circuits with other MIC components.

SUMMARY OF THE INVENTION

In a preferred embodiment, the invention is a double balanced mixer of the star modulator type, with waveguide RF and LO ports and a coaxial IF port. This embodiment of the mixer comprises a dielectric substrate, metalized on both sides, with patterns forming transitions from waveguide to a four-wire balanced line, four beam-lead mixer diodes mounted on the four-wire line, and a split-block waveguide housing, containing the coaxial IF connector, and within which the metalized substrate is clamped. The dielectric circuit board uses metalized through-holes in appropriate places to provide electrical connection between the metalized layers on each side, where required.

In another embodiment of the invention, dc blocking capacitors may be mounted on the circuit board, and biasing networks may be included in the metalization pattern, providing a biasable version of the mixer.

In another embodiment of the invention the LO and RF are fed in via other MIC media, e.g. microstrip, stripline, slotline, finline, or coplanar line, rather than waveguide. In those instances where the input line is unbalanced, as with microstrip or stripline, some form of balun may be required.

DETAILED DESCRIPTION OF THE DRAWINGS

Figure 1:
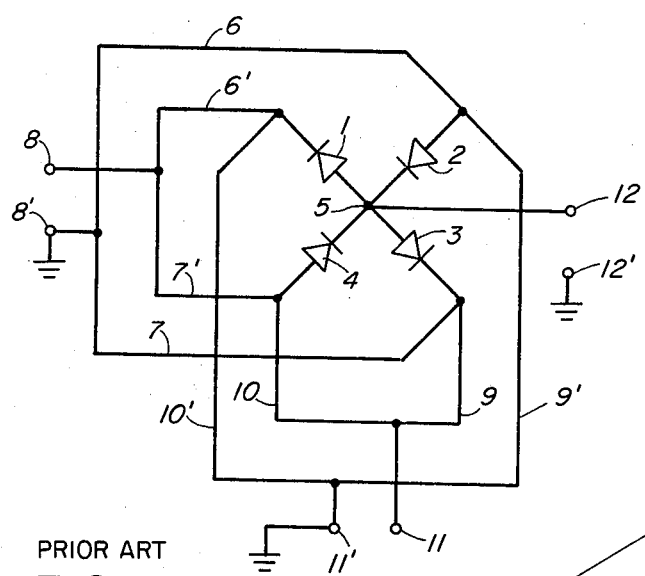
FIG. 1 is a schematic diagram of a star modulator double balanced mixer.

FIG. 1 shows a prior art schematic diagram of a star modulator double balanced mixer. The mixer consists of four diodes 1-4, respectively, joined at a common star-configuration point 5. The anodes of two diodes, 1 and 3, and the cathodes of two diodes 2 and 4, are connected to the common point 5. The other ends of diodes 1 and 2 are connected across a first balanced two-wire line 6, 6' while the other ends of diodes 3 and 4 are connected across a second balanced two-wire line 7, 7'. The balanced two-wire lines 6, 6' and 7, 7' are connected in parallel with a common two-wire line 8, 8' which may be either unbalanced, as shown in the figure, or balanced. If the common line 8, 8' is unbalanced, the first and second lines 6, 6' and 7, 7' must incorporate a balun structure, or a balanced-to-unbalanced line transformer. Similarly, diodes 2 and 3 are connected across a third balanced two-wire line 9, 9', and diodes 1 and 4 are connected across a fourth balanced two-wire line 10, 10'. The third and fourth lines 9, 9' and 10, 10' are connected in parallel with a second common line 11, 11'.

Terminals 8, 8' and 11, 11' are the RF input (or output in case of up-converter operation) and LO input, respectively, and may be used interchangeably. The IF is extracted (or fed in, for an up-converter) between the common point 5 and ground via an unbalanced 2 wire line 12, 12'.

The structure of a mixer of the present invention in its preferred embodiment, that is with waveguide RF and LO ports and coaxial IF port, is illustrated in FIGS. 2-9. The mixer has a dielectric substrate board 13 with metal patterns 14 and 15 formed on each side, respectively, constituting the circuit board 16, which is clamped between two channeled metallic blocks 17 and 18. The channels, when clamped together, form a standard sized rectangular waveguide, with a reduced-width region in the center 19, 20. The circuit board 16 is parallel to the narrow walls of the waveguide. In this position the circuit board is parallel to the E-field of the TE$_{10}$ mode. A coaxial connector or line 21 passes through the side wall of one channeled block 17 in the reduced width region. The center conductor 22 makes electrical contact with the metal patterns 14 and 15 on both sides of the dielectric substrate 13 (see FIG. 9), while the dielectric 23 in the coaxial connector ends at the reduced-width waveguide wall 19.

Figure 3:
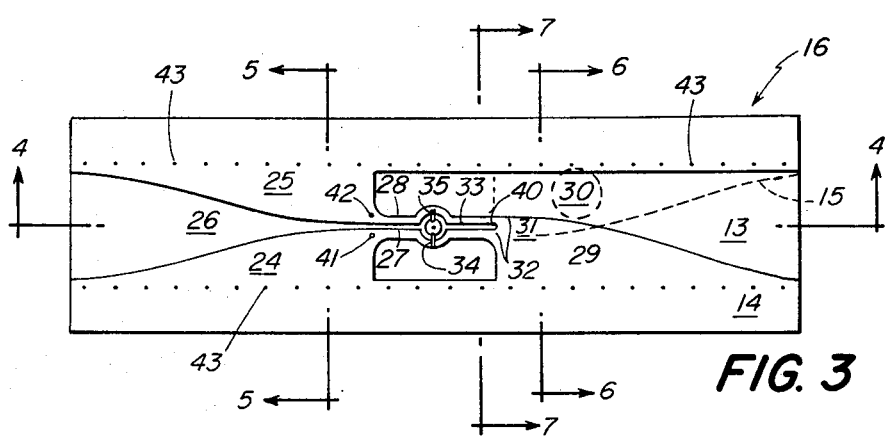
FIG. 3 is a diagram of the metalization pattern on the mixer printed circuit board.
Figure 5:
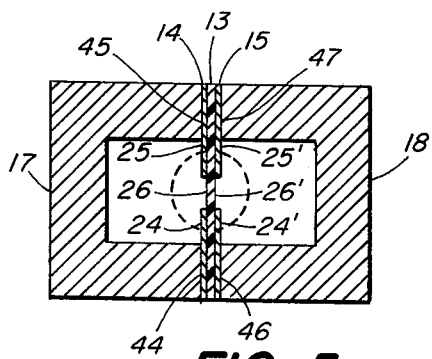
FIGS. 5–7 are transverse cross-sections of the mixer taken on lines 5—5, 6—6, and 7—7, of FIGS. 3 and 4, respectively.
Figure 5A:
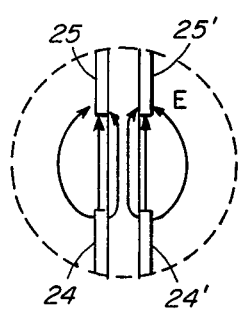
FIGS. 5A, 6A, 7A and 7B schematically indicate the electric field patterns excited on the conductors at each of the foregoing cross-sections.

Consider now the details of the metal patterns 14 and 15 on the circuit board 16 as shown in FIGS. 3 and 5-8, and assume for the purposes of illustration that RF energy is introduced at the waveguide port on the left in FIG. 3. The metal areas 24, 24' and 25, 25' of the metal patterns 14 and 15, respectively, (primed numbers refer to the feature on the far side of the board 16 in the metal layer 15 corresponding to the feature in the metal layer 14 denoted by an unprimed number) are tapered electrical conductors which form a transition from the full-height waveguide at the RF input port to a finline, or ridge-guide configuration with slots 26, 26' between the fin-line conductors 24, 24' and 25, 25' on both sides of the substrate 13, as is shown in FIG. 5. Since the conductors on the two faces of the substrate will be at the same potential when driven from the waveguide operating in the TE$_{10}$ mode, for example, the lines 24 and 25 and 24' and 25' constitute two slot lines driven in parallel and in phase. The electric fields in these slots are substantially parallel to the substrate, as indicated in FIG. 5A. Since the slot lines are fed from balanced waveguide, there is no need for a balun. At the narrow ends of the slots, the RF energy is concentrated in the vicinity of the slots 26, 26'. In this region the fins may be disconnected from the top and bottom (wide) walls of the waveguide to form a balanced four-wire line 27, 27', 28, 28'.

Figure 6:
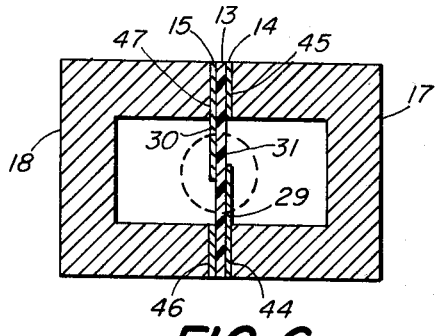
Figure 6A:
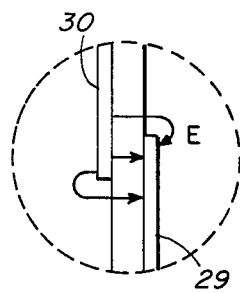
Figure 7:
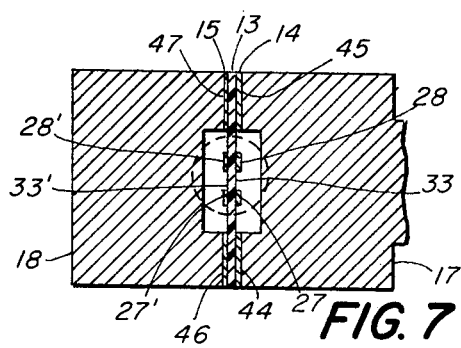

Assume, further, that LO energy is introduced at the waveguide port on the right in FIG. 3, where metal areas 29 and 30 of the metallized patterns 14 and 15, respectively, on opposite faces of the substrate 13 are tapered electrical conductors which form a transition to an overlapped finline 31, as is shown in FIG. 6. Virtually all of the LO energy is concentrated in the overlapped region with the electric fields oriented substantially transverse to the substrate, as indicated in FIG. 6A. The fins may again be disconnected from the top and bottom walls of the waveguide, as indicated. In the same region 32, the metal pattern on each side of the substrate may be bifurcated to form slots 33 and 33', thereby forming an extension of the balanced four wire line 27, 27', 28, 28', as is shown in FIG. 7. Here again there is no need for a balun to feed the balanced four-wire line from waveguide.

Figures 7A, 7B:
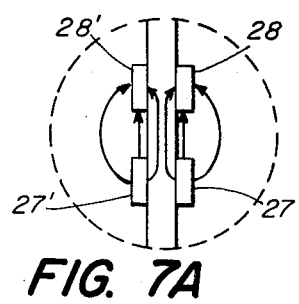

Thus, the invention provides a balanced four-wire line 27, 27', 28, 28' driven from opposite ends in two of the four possible orthogonal modes on the conductor system. FIGS. 7A and 7B indicate the field patterns of the modes fed from the slot line and overlapped finline ends respectively; these may be called the parallel and transverse modes, referring to the orientation of the E-fields relative to the original waveguide fields or the plane of the circuit board. The other two modes, with the fields oriented diagonally across the substrate, are not intentionally excited.

Figure 8:
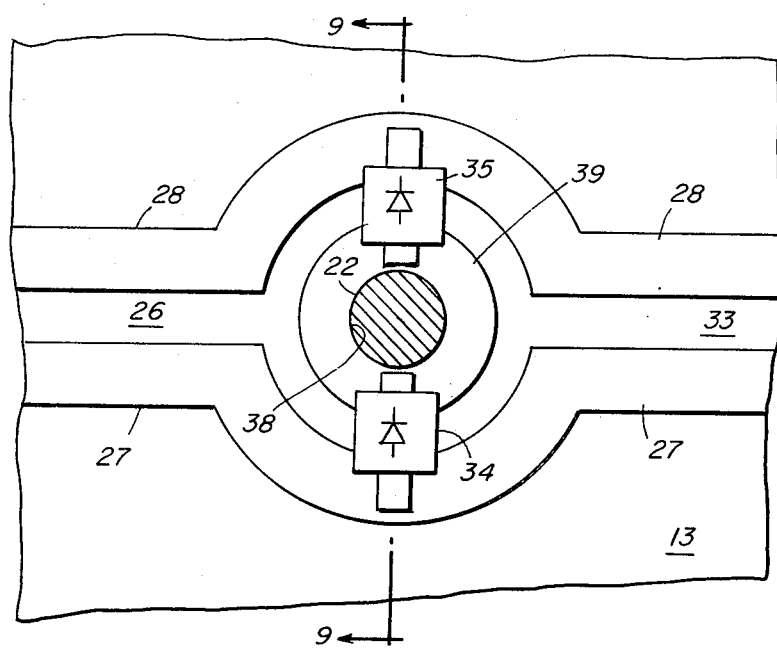
FIG. 8 is an enlarged view of a portion of FIG. 3, showing details of the diode mount configuration.
Figure 9:
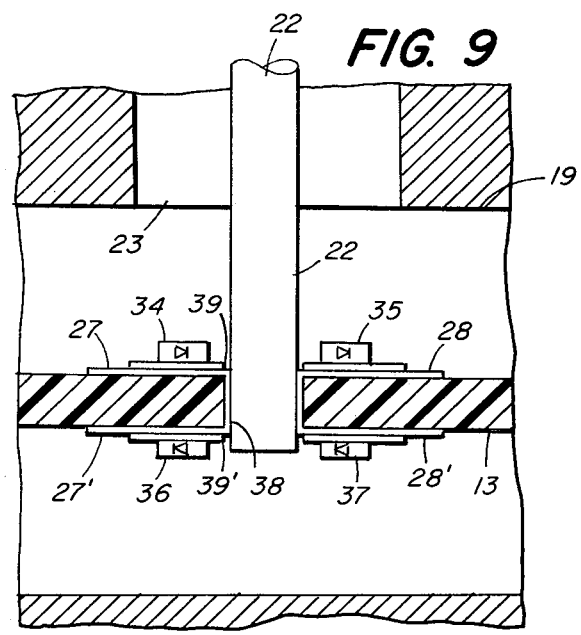
FIG. 9 is a section on line 9—9 of FIG. 8.

The mixer diodes 34, 35, 36 and 37 are located at the center of the four-wire line, arranged as shown best in FIGS. 8 and 9. A plated-through hole 38 with an annular bonding pad 39, 39' on each side of the dielectric substrate 13 electrically connects the two sides and provides a star-configuration mounting point for the center conductor 22 of the IF output. The diodes, shown as beam lead devices in the drawings, are mounted from the center contact 38, 39' to each of the four balanced lines 27, 27', 28, 28', respectively, in the respective orientations shown, to form a star configuration. Thus, two diodes 34, 35 on one side of the dielectric substrate 13 are connected in series between the two conductors 27, 28 on that side, and at their intermediate terminals to the center point at 39. Similarly, the remaining two diodes 36, 37 are connected in series between the other two conductors 27' and 28', and at their intermediate terminals to the center point at 39'.

Referring again to FIG. 3, the parallel mode (FIG. 7A) launched from the slot lines 24, 25 and 24', 25' is terminated by a short circuit 40, 40' at the end of each slot 33, 33', respectively, formed in the bifurcation, 32, 32' of the overlapped fin line 31. These short circuits are preferably located approximately a quarter-wavelength from the diodes at the RF center frequency, to reflect an open circuit at the diodes. Similarly, the transverse mode must be terminated in a short circuit on the opposite side of the diodes a quarter wavelength away at the LO center frequency. This is accomplished with a pair of plated-through holes 41, 42 tying the two slot lines together at the quarter-wave termination point.

A series of plated-through holes 43 are located along the length of the circuit board in the inactive areas between the clamping faces 44, 46 and 45, 47 of the channeled blocks 17 and 18. These holes suppress the excitation of spurious modes within the dielectric substrate 13 between the metal coatings 14 and 15, which may have deleterious affects on the mixer operation.

It should be noted that for the purpose of illustration arbitrary labels have been given to the slot line port (RF) and the overlapped fin port (L.O.). These labels are, however, completely interchangeable and the RF and L.O. signals may be fed into the respective opposite waveguide ports.

Figure 2:
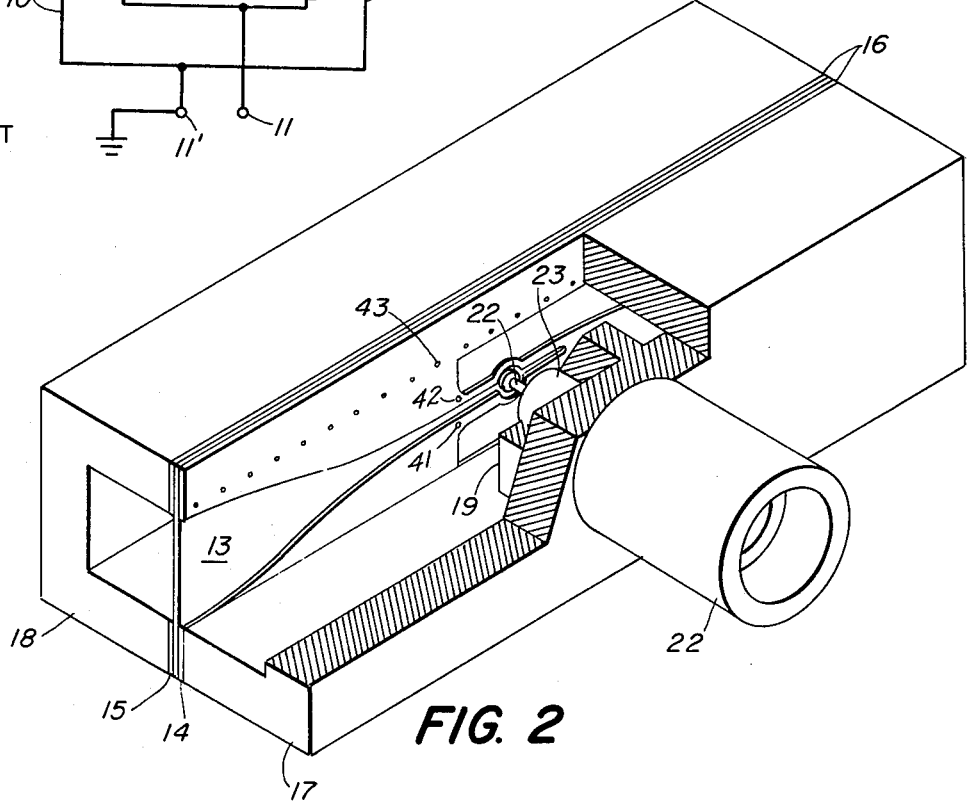
FIG. 2 is a cutaway view of a preferred embodiment of the mixer of the present invention.
Figure 4:
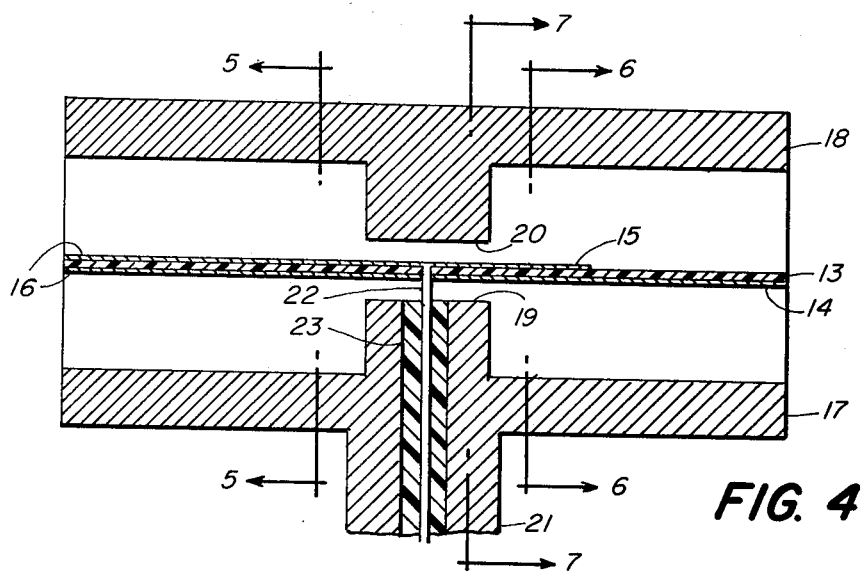
FIG. 4 is a longitudinal cross-section of the mixer taken on line 4—4 of FIG. 3.

The principal factor limiting the IF bandwidth of the illustrated embodiment is the length of the ground return path from the points of the diode star connected to the balanced 4-wire lines 26, 26', 27, 27', respectively, to the waveguide wall and the outer conductor of the coaxial output line 21. It is to keep this path (via the short-circuit terminations 40, 40', 41 and 42 and the waveguide walls) as short as possible, that the waveguide narrow side walls 19, 20 are moved in close to the four-wire line 27, 27', 28, 28' in the region occupied by that line, as illustrated in FIG. 2 and FIG. 4. By this method, the ground return path length can be made short enough to obtain RF/IF band overlap with only moderate degradation in conversion loss.

A mixer as described, intended for use in the Ka-band, could be installed in WR-28 waveguide. A double slot-line gap of 0.005" on a 0.010" low-dielectric constant (p approximately 2.2) substrate has a characteristic impedance of approximately 75 ohms. After bifurcation, each slot line will be at approximately 150 ohms in the parallel even mode which is a convenient level to drive a pair of diodes in series (see FIG. 8). To obtain the same impedance level for the transverse even mode, the lines will be approximately 0.008" wide. One quarter wide wavelength on the four-wire line will be approximately 0.080". The transitions from waveguide to slot or microstrip line are approximately 0.4" long. Thus, an entire Ka-band double balanced mixer can be housed within approximately a 1" axial length of waveguide between two ¾" square type UG-599/U (Ka-band) rectangular coupling flanges (not shown). Furthermore, the geometry is extremely simple, with two in-line waveguide inputs and a coaxial output at right angles to the waveguide. Because the four-wire section is comparatively small, it is possible to obtain a mixer conversion loss very close to the losses attainable in an all waveguide structure.

Figure 10:
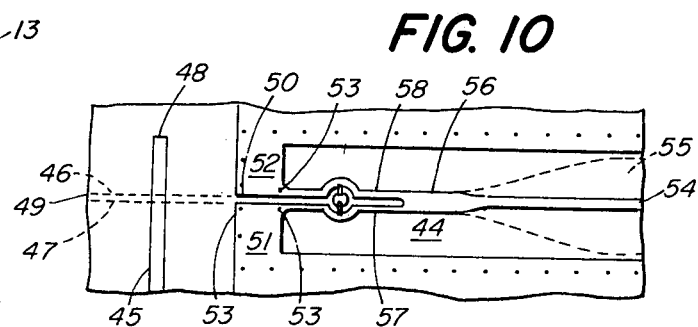
FIG. 10 is a portion of the printed circuit board pattern for another embodiment of the invention.

In many applications, it may be desirable to feed the RF and/or LO to the mixer from an unbalanced line, such as microstrip or stripline, rather than waveguide. FIG. 10 illustrates a portion of a circuit board pattern for another embodiment of the invention, employing microstrip RF and LO feed lines.

On the left in the figure, an input microstrip line 45 on one side of the substrate 44 crosses a slot 46 in a metal coating on the other side of the substrate forming a ground plane 47, and the microstrip line extends about $\lambda/4$ beyond the slot, terminating in an open circuit 48. The slot 46 also extends beyond one side of the microstrip line 45 about $\lambda/4$, terminating in a short circuit 49. This arrangement constitutes a microstrip-to-single slot-line transition, including an unbalanced-to-balanced line transformation, according to prior art shown in FIG. 3 in U.S. Pat. No. 3,688,225. The single slot line 46 in the ground plane conductor 47 continues to the right where it joins another slot 50 in a metal coating (not labelled) on the top of the substrate, forming with it a parallel pair of slot lines similar to those formed by the fin-lines in the embodiment of FIGS. 2–9. The fins 51 and 52 on one side of the substrate 44 are electrically connected together with the fins formed by the ground plane 47 on the other side of the substrate via plated-through holes 53 (typical), the two of which nearest to the diode configuration correspond to the short-circuits 41 and 42 in FIG. 3.

On the right in FIG. 10, the microstrip-to-4-wire line transition and balun consists simply of a microstrip line 54 on the top side of the substrate over a ground plane conductor 55 on the underside, which tapers smoothly to a two-wire line 56, as shown, for example, in FIG. 9 in U.S. Pat. No. 3,652,941. In the transition illustrated in FIG. 10, the ground plane 55 narrows and the microstrip line 54 widens to a common width such that the line impedance remains constant. The resulting two-wire line 56 is then bifurcated on both sides of the substrate 44, forming a 4-wire line comprised of a pair of wires 57, 58 on one side of the substrate, and another pair of companion wires (not shown) on the other, as in the embodiment of FIGS. 2–9, inclusive.

Figure 11:
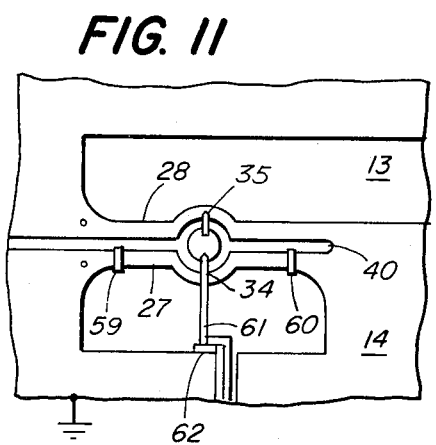
FIG. 11 shows an arrangement for providing dc bias to the mixer diodes.

FIG. 11 illustrates one way to introduce dc bias to mixer diodes according to the invention. FIG. 11 shows one side of the dielectric substrate 13 in the 4-wire line region, corresponding to the first embodiment for purposes of illustration. On each side of one of the diodes 34, the wire 27 connected to that diode is interrupted by a narrow gap into which is mounted a dc blocking capacitor 59, 60, respectively. A narrow, high impedance bias lead 61 is provided in the metal pattern 14 on the dielectric substrate 13 connecting the d.c.-blocked wire 27 with an external terminal (not shown). An RF bypass capacitor 62 is mounted between the bias lead and ground, approximately $\lambda/4$ from the d.c.-blocked wire 27. The dc return to ground exists via the other wire 28 on the same side of the dielectric substrate, thus placing the two diodes (34, 35) which are on the same side of the substrate in series with respect to the d.c. bias. The wires on the other side of the dielectric substrate are similarly treated, except that line 28' will have the bias lead and d.c.-blocking capacitors, and line 27' will provide the d.c. return, if only one polarity of bias voltage is desired.

Figure 12:
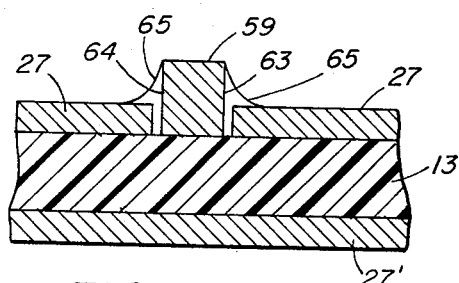
FIG. 12 shows a preferred mode of mounting the dc blocking and RF bypass capacitors in the biasable version of FIG. 11.

FIG. 12 indicates a preferred mounting for the d.c. blocking and RF bypass capacitors. The capacitor, e.g. 59, is a block of high permittivity dielectric material, preferably titanium dioxide or barium titanate, metalized on two faces 63, 64. The metalized dielectric block 59 is inserted in the gap in the line 27, resting on the dielectric substrate 13, where it may be bonded in place by solder or conductive epoxy 65.

I claim:

1. A double-balanced mixer of the star-configuration type for microwave-frequency electromagnetic waves comprising, a sheet of dielectric substrate, two electrical conductors on each side of said substrate forming a balanced four-wire line in a substantially rectangular configuration, first terminal means coupled to said line in a parallel mode, second terminal means coupled to said line in a transverse-mode, a common star-configuration point electrically available from both sides of said substrate in the vicinity of said four-wire line, four non-linear devices connected two in series defining an intermediate terminal therebetween and with the two connected between the two conductors on each side of said substrate and having their respective intermediate terminals connected to said common point, a common reference terminal for said four-wire line, and third terminal means connected between said common point and said common reference terminal.

2. A double-balanced mixer according to claim 1 comprising a length of field-confining waveguide having an E-field, operating mode and median longitudinal axis and, having a first port at one end and a second port at the other end, said sheet of dielectric substrate being mounted across said waveguide parallel to the E-field in the operating waveguide mode and extending substantially parallel to the median longitudinal axis of the waveguide substantially from one of said ports to the other, said balanced four-wire line being located in a limited region of said waveguide between said ports, first electrical-conductor transitions on said substrate from one of said ports to said four-wire line for coupling to said line in a parallel-mode, and second electrical-conductor transitions on said substrate from the other of said ports to said four-wire line for coupling to said line in a transverse-mode, and said third terminal means connecting said common terminal to the exterior of said waveguide between said first and second ports.

3. A mixer according to claim 2 wherein the said conductors have a return path and the waveguide a transverse dimension, and in which (a) the transverse dimension of said waveguide is reduced in said limited region so as to minimize the length of the return path between each of said conductors where connecting to a diode and said third terminal means.

4. A mixer according to claim 2 wherein the waveguide has opposite narrow walls and opposite wide walls, and in which said first transitions comprise two fin-conductors on one side of said substrate and two similar fin-conductors on the other side forming a transition from the wide walls of said waveguide at said one port to two separate slot lines one on each side of substrate, each of said fin-conductors being connected (in said intermediate region directly) to a respective one of said conductors of said four-wire line.

5. A mixer according to claim 2 wherein the waveguide has opposite narrow walls and opposite wide walls and in which said second transitions comprise two conductors located one on each side of said substrate forming a transition from the wide walls of said waveguide at said other port to a microstrip two-sire balanced line consisting essentially of one conductor on each said side approaching said four-wire line, each of said microstrip conductors being longitudinally bifurcated to provide individual respective connections with the conductors of said four-wire line that are on the same side of said substrate.

6. A mixer according to claim 2 wherein the waveguide has opposite narrow walls and opposite wide walls and in which said waveguide is rectangular, said substrate is mounted between the wide walls of it, and said waveguide is reduced in width between its narrow walls in the region of said four-wire line.

7. A mixer according to claim 1 in which said four-wire line is terminated for said parallel mode by short-circuits between two pairs of said wires, each pair being on the same side of said substrate located approximately a quarter-wave from said common point on the side thereof away from said one port for the frequency propagated through said one port, and said four wire line is terminated for said transverse mode by short-circuits between two pairs of said wires, each pair being on opposite sides of said substrate located approximately a quarter-wave from said common point on the side thereof away from said other port for the frequency propagated through said other port.

8. A mixer according to claim 1 wherein said first terminal means comprises a microstrip-to-single slotline transition which includes an unbalanced-to-balanced line transformation, said slotline transition connecting to said two electrical conductors on one side of said substrate, and means on the other side of said substrate forming a second slotline joining said two electrical conductors on said other side.

9. A mixer according to claim 1 wherein said second terminal means comprises a microstrip line on one side of said substrate over means forming a ground plane conductor on the other side of said substrate, said ground plane conductor being tapered toward said four-wire line to form with said microstrip line a two-wire line, and means to bifurcate each conductor of said two-wire line for connection with said four-wire line.

10. A mixer according to claim 1 in which one of the four wire line conductors on each side of said substrate is electrically isolated with a d.c. blocking capacitor located, respectively, on each side of the connection between that conductor and its diode, and a d.c. bias lead is connected to the isolated wire, for providing d.c. bias to said diode.

* * * * *